US011217519B2

United States Patent
Qin

(10) Patent No.: US 11,217,519 B2
(45) Date of Patent: Jan. 4, 2022

(54) FLEXIBLE DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Xuesi Qin, Wuhan (CN)

(*) Notice: Subject to any disclaimer, the term of this patent is extended or adjusted under 35 U.S.C. 154(b) by 427 days.

(21) Appl. No.: 16/344,083

(22) PCT Filed: Dec. 14, 2018

(86) PCT No.: PCT/CN2018/121255
§ 371 (c)(1),
(2) Date: Apr. 23, 2019

(87) PCT Pub. No.: WO2020/093526
PCT Pub. Date: May 14, 2020

(65) Prior Publication Data
US 2021/0327798 A1    Oct. 21, 2021

(30) Foreign Application Priority Data

Nov. 6, 2018 (CN) .......................... 201811314045.0

(51) Int. Cl.
*H01L 23/498* (2006.01)
(52) U.S. Cl.
CPC .... *H01L 23/49838* (2013.01); *H01L 23/4985* (2013.01); *H01L 23/49811* (2013.01)
(58) Field of Classification Search
CPC .... H05K 1/11; H05K 1/14; H05K 1/181–189; H01L 23/498; H01L 23/4985; H01L 23/49838; H01L 23/49811; H01L 27/12; H01L 27/124; H01L 27/1218; H01L 27/1222–1248; G06F 1/16; G06F 1/1609; G06F 1/1652

(Continued)

(56) References Cited

U.S. PATENT DOCUMENTS

| 10,268,238 B2* | 4/2019 | Hamburgen | ........ H04M 1/0268 |
| 2015/0179728 A1* | 6/2015 | Kwon | ................. H01L 51/0097 257/40 |

(Continued)

FOREIGN PATENT DOCUMENTS

| CN | 107393421 A | 11/2017 |
| CN | 207233319 U | 4/2018 |

(Continued)

*Primary Examiner* — Tuan T Dinh
(74) *Attorney, Agent, or Firm* — JMB Davis Ben-David

(57) ABSTRACT

A flexible display panel and a display device are provided. The flexible display panel includes a bending region and a display region. The bending region includes a plurality of metal wirings; each metal wiring is in long strip shape and includes a metal strip; a plurality of openings are defined through the metal strip. In the width direction of the metal strip, a ratio of a minimum distance from a point of an edge of the one of the openings to a neighboring side of the metal strip to a minimum width of the metal strip ranges from 0.1 to 0.7. A wiring structure of the bending region can prevent a stress concentration of the bending region, enhance a strength during a bending process, and avoid a breakage of the metal wiring.

9 Claims, 11 Drawing Sheets

(58) Field of Classification Search
USPC ........ 361/749–750, 760–764, 775–778, 795,
361/803; 174/250–258; 349/349–152
See application file for complete search history.

(56) References Cited

U.S. PATENT DOCUMENTS

| | | | |
|---|---|---|---|
| 2016/0035812 A1* | 2/2016 | Kwon | H01L 29/66757 |
| | | | 257/40 |
| 2016/0105950 A1* | 4/2016 | Drzaic | H05K 1/0296 |
| | | | 174/251 |
| 2016/0240602 A1* | 8/2016 | Ki | H01L 27/3276 |
| 2017/0271617 A1* | 9/2017 | Choi | H01L 51/0097 |
| 2017/0277288 A1* | 9/2017 | Choi | G06F 3/0412 |
| 2017/0278918 A1* | 9/2017 | Jeon | H01L 27/323 |
| 2017/0352717 A1* | 12/2017 | Choi | H01L 27/3276 |
| 2018/0088390 A1* | 3/2018 | Ohara | H01L 27/3276 |
| 2018/0092166 A1* | 3/2018 | Kim | H01L 51/0097 |
| 2019/0187843 A1 | 6/2019 | Ye | |

FOREIGN PATENT DOCUMENTS

| | | |
|---|---|---|
| CN | 107977116 A | 5/2018 |
| CN | 108122884 A | 6/2018 |
| CN | 108172122 A | 6/2018 |
| CN | 207624291 U | 7/2018 |

\* cited by examiner

FLEXIBLE DISPLAY PANEL AND DISPLAY DEVICE

CROSS-REFERENCE TO RELATED APPLICATIONS

This is the U.S. National Stage of International Patent Application No. PCT/CN2018/121255, filed Dec. 14, 2018, which in turn claims the benefit of Chinese Patent Application No. 201811314045.0 filed Nov. 6, 2018.

FIELD OF THE INVENTION

The present relates to a flexible display technical region, in particular to a flexible display panel and a display device.

BACKGROUND OF THE INVENTION

With flexible display panels are popularized, the demand for durability of bending of the flexible display panels becomes higher and higher nowadays. FIG. 1 is a plan view of a bending region of the prior art device. The flexible display panel includes a display region 12, a bending region 11, and a driving circuit 13, wherein the bending region 11 is located at a lower side of the flexible display panel. Since the bending region 11 needs to withstand the weight of the flexible panel and is an area of the flexible display panel which has a high risk of breakage, the strength and toughness of the bending region 11 are significantly important. FIG. 2 is an enlarged view of a plurality of metal wirings in the bending region 11. FIG. 3 is an enlarged view of one of the metal wirings; an edge of the metal wiring 14 is in a linear shape; and a plurality of openings 16 are arranged neatly and evenly distributed along the metal wiring 14. A position 15 is marked as a place having a high-risk of breakage. Since the bending region is a layered structure, when the display panel is bent, an area having a high risk of breakage will be formed at a position between an edge of the metal wiring 14 and each of the openings 16.

FIG. 4 is a stress distribution diagram of the bending metal wiring structure of the prior art device. The x-axis is a direction along which the metal wiring is extended, and the y-axis is the magnitude of a stress value. It can be seen from FIG. 4 that the stress distribution of the bending metal wiring is not uniform, and the stress is relatively concentrated in the place having a high risk of breakage areas, which is near the edges of the metal wiring and the openings, and which easily leads to breakage of the metal wiring.

SUMMARY OF THE INVENTION

The object of the invention is to provide a flexible panel or a display device, which can effectively solve the technical problem of stress concentration in bending region of the metal wirings and easy breakage of the bending region in the existing flexible display panel.

In order to solve the above technical problems, the present invention provides a flexible display panel including a display region and a bending region. The bending region includes a plurality of metal wirings, a flexible substrate, an inorganic film layer, and a coating layer.

Each of the metal wirings is in a long strip shape and includes a metal strip and a plurality of openings through the metal strip. In the width direction of the metal strip, a ratio of a minimum distance from a point of an edge of one of the openings to a neighboring side of the metal strip to minimum width of the metal strip ranges from 0.1 to 0.7.

Further, the bending region also includes: a flexible substrate; and an inorganic film layer, one side of the inorganic film layer being attached to the flexible substrate, and the other side of the inorganic film layer being attached to a metal wiring layer; wherein two or more of the metal wirings are parallel to each other and evenly distributed in the bending region.

Further, the bending region also includes a coating layer which is attached to a side of the metal wiring layer away from the inorganic layer.

Further, the coating layer is made of organic material, and the coating layer fills the openings and covers the metal wirings.

Further, each of the metal wirings includes at least one notch provided in at least one side of each metal wiring.

Further, two or more of the openings are arranged in a straight line and evenly distributed along the metal strip, and portions of the metal strip between the middle of each notch and two adjacent openings are symmetrically disposed.

Further, the notches each are in an arcuate or a semicircular shape.

Further, a bottom of a cross section of each of the notches is a smooth arc.

Further, the smooth arc is a sinusoid, a parabola or a circular arc.

In order to solve the above problems, the present invention also provides a display device including the flexible display panel described above.

Advantageous Effects of the Present Invention

The present invention provides new a flexible display substrate and a display device, the problem of uniform stress at different positions of the metal wirings is solved by changing the shape of the metal wirings in the bending region of the panel, thereby effectively reducing the occurrence of breakage of the display panel when it bent.

DESCRIPTION OF DRAWINGS

In other to more clearly illustrate the technical solutions in embodiments of the present invention, drawings used in the description of embodiments will be briefly described below. Apparently, the drawings in following description are only some embodiments of the present invention, those skilled in the art can derive other drawings according to these drawings without paying creative efforts.

DETAILED DESCRIPTION OF PREFERRED EMBODIMENTS

Figure 1:
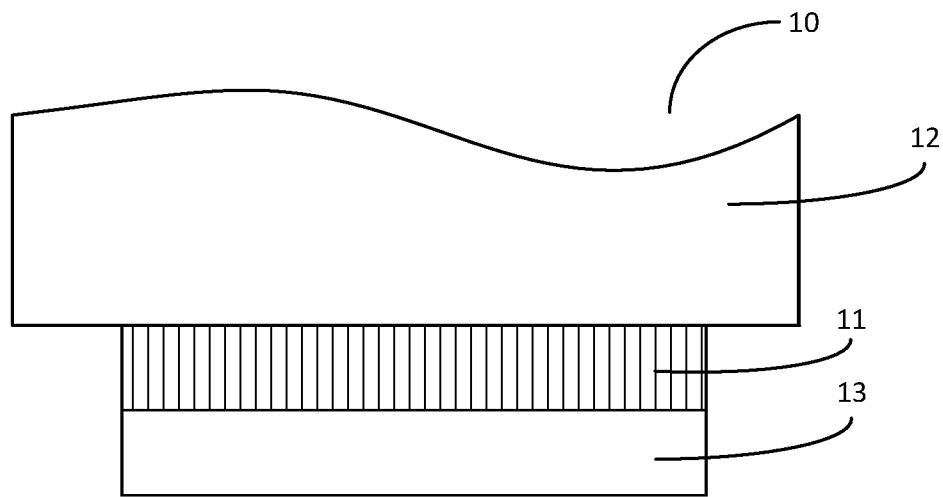
FIG. 1 is a schematic view showing the position of a bending region of the prior art device.
Figure 2:
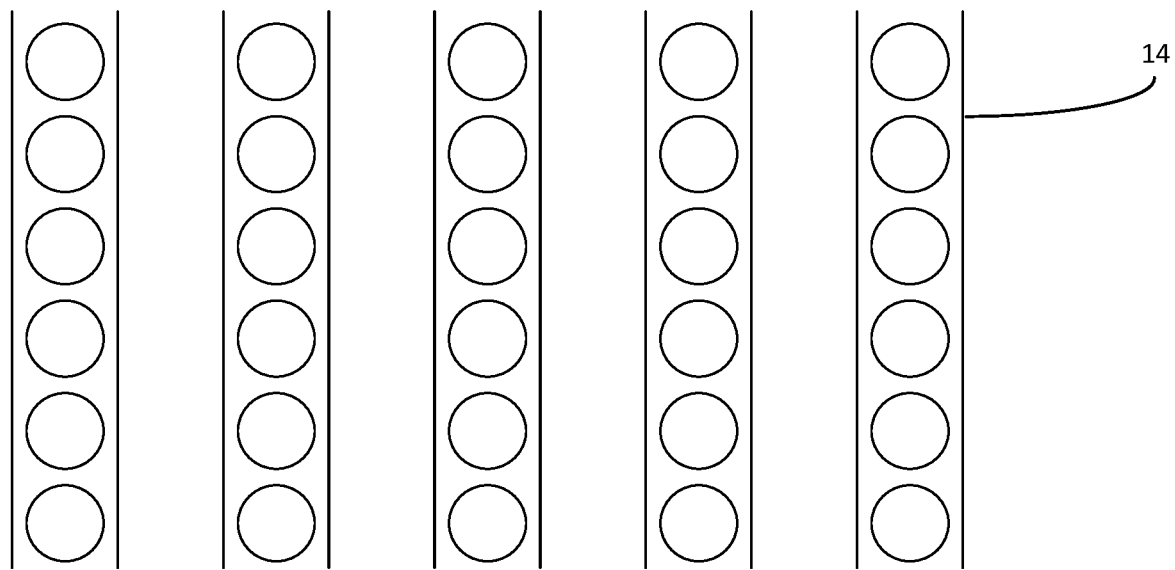
FIG. 2 is a schematic view showing an enlarged metal wiring of the bending region of the prior art device.
Figure 3:
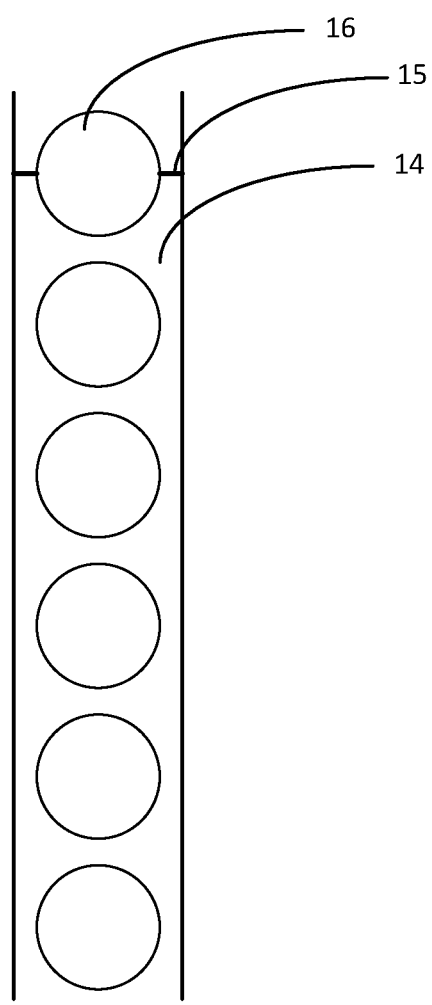
FIG. 3 is a schematic view showing a break region of a metal wiring in the bending region of the prior art device.
Figure 4:
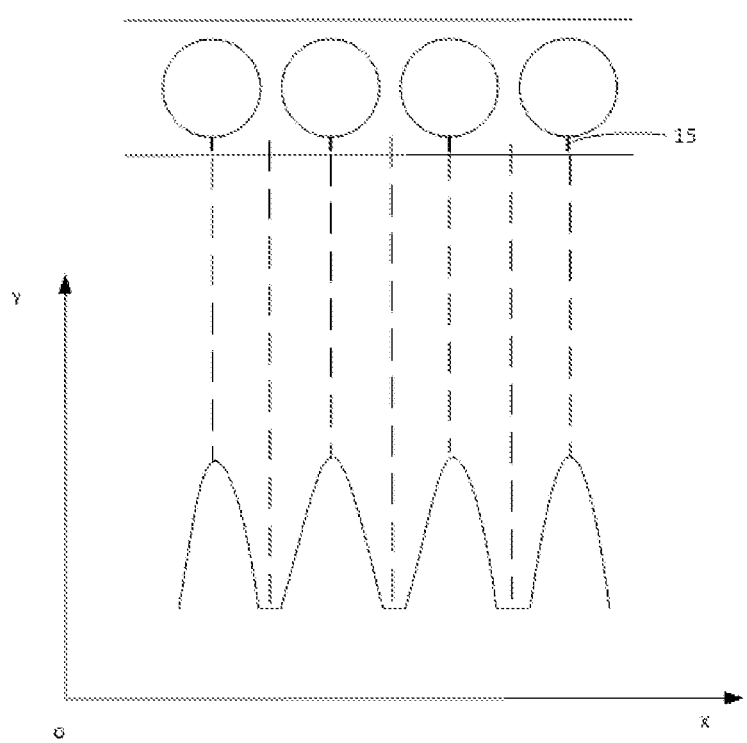
FIG. 4 is a stress distribution diagram of the metal wiring in the bending region of the prior art device.

The embodiments of the present invention are described in detail below, examples of the embodiments are shown in the accompanying drawings, wherein same or similar reference numerals are used for denoting same or similar elements or other elements having same or similar functions. The embodiments described below with reference to the drawings are only used for constructing the present invention instead of limiting the present invention.

In the description of the present invention, it is to be understood that terms "center", "longitudinal", "lateral", "length", "width", "thickness", "upper", "lower", "front", "rear", "left", "right", "vertical", "horizontal", "top", "bottom", "inner", "outer", "clockwise", "counterclockwise", etc. are based on the orientation or positional relationship shown in the accompanying drawings. The terms are only for convenience of describing the present invention and simplifying the description, instead of indicating or implying that the device or element referred to must have a specific orientation, constructed and operated in a particular orientation. In addition, terms "first", "second", are used for descriptive purposes only and are not to be construed as indicating or implying a relative importance or implicitly indicating the number of technical features indicated. Thus, features defining "first" or "second" may include one or more of the described features either explicitly or implicitly. In the description of the present invention, the meaning of "a plurality of" is two or more unless otherwise specifically defined.

In the description of the present invention, it should be noted that terms "mounted", "connected", "contacted" should be understood broadly unless explicitly stated and defined otherwise. For example, it may be a fixed connection, a detachable connection, or an integral connection; it may be a mechanical connection, an electrical connection or may communicate with each other; it can be directly connected or indirectly connected through an intermediate medium, which can be the internal communication of two elements or the interaction of two elements. For those skilled in the art, the specific meanings of the above terms in the present invention can be understood according to specific circumstance.

In the present invention, a first feature "on" or "under" a second feature may include direct contact of the first and second features, or may be included that the first and second features are not in direct contact but are contacted by additional features between them. Moreover, the first feature "on", "above", "upper" the second feature may include the first feature directly above or above the second feature, or merely the first feature level being higher than the second feature. The first feature "beneath", "under", "below" may include the first feature directly below or below the second feature, or merely the first feature level being less than the second feature.

The following disclosure provides many different embodiments or examples for implementing different structures of the present invention. In order to simplify the disclosure of the present invention, the components and arrangements of the specific examples are described below. Of course, they are merely examples and are not intended to limit the invention. Furthermore, the present invention may repeat reference numerals and/or reference letters in different examples, the repetition is for the purpose of simplification and clarity, but not indicate the relationship between the various embodiments and/or arrangements discussed. In addition, the present invention provides examples of a plurality of specific processes and materials, but those skilled in the art can recognize the use of other processes and/or the use of other materials.

First Embodiment

Figure 5:
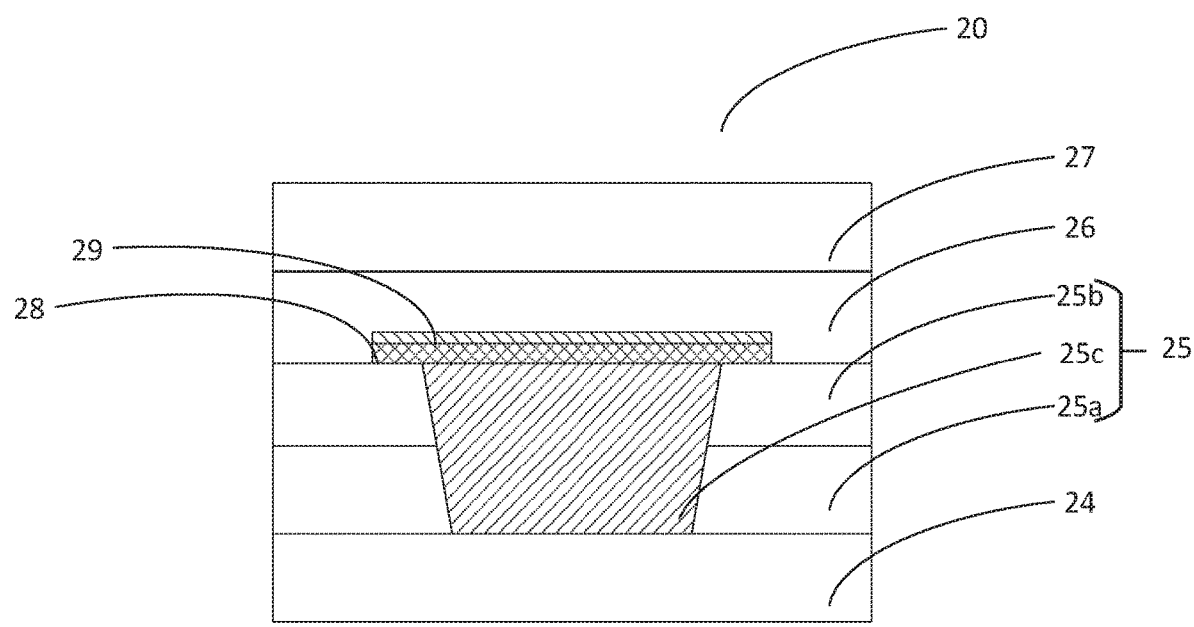
FIG. 5 is a cross-sectional view showing the layered structure of the bending region according to a first embodiment of the present invention and a second embodiment of the present invention.
Figure 6:
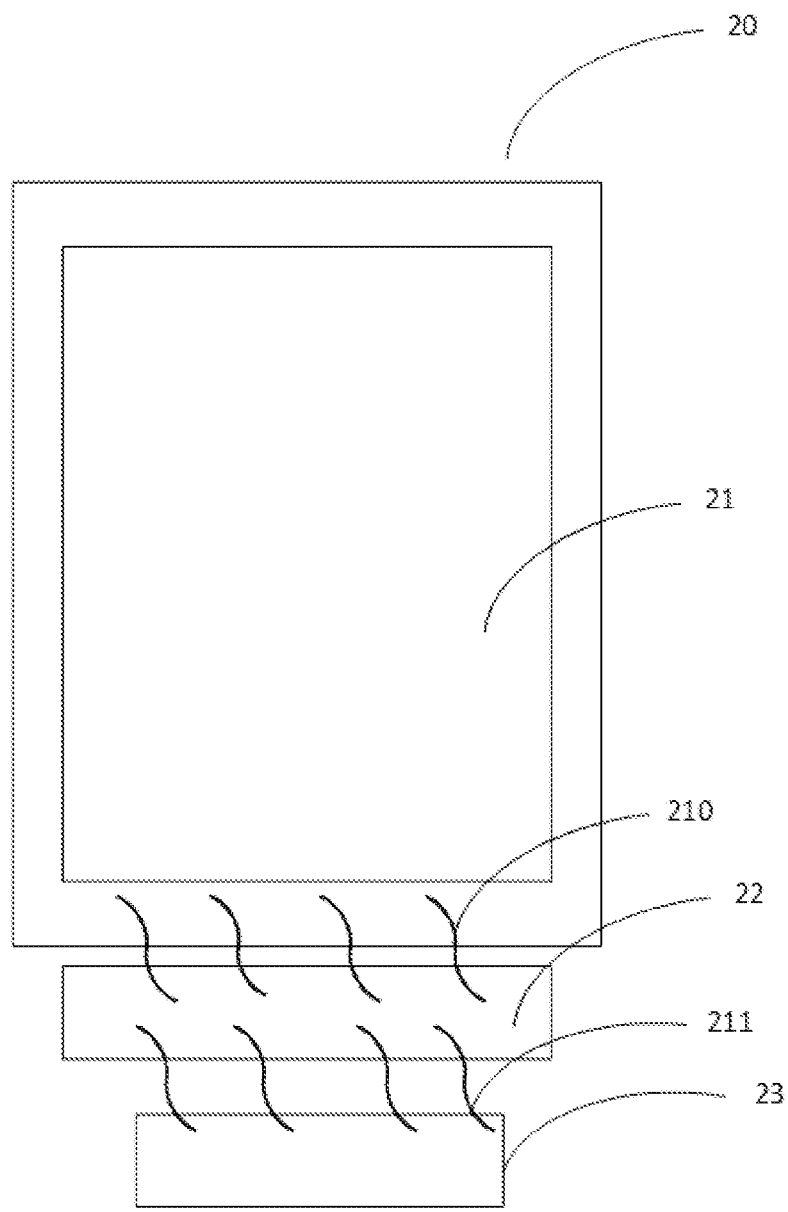
FIG. 6 is a schematic view of the flexible display panel according to the first embodiment of the present invention and the second embodiment of the present invention.

FIG. 5 is a cross-sectional view showing the layered structure of the bending region provided by the present invention. FIG. 6 is a schematic view of the flexible display panel provided by the present invention.

As shown in FIG. 5 and FIG. 6, the flexible display panel provided by the present invention includes a display region 21, a bending region 22 and a drive circuit 23. The bending region 22 includes a flexible substrate 24, an inorganic film layer 25, a metal wiring layer 28, and a coating layer 29. Generally, the flexible substrate 24 is made of a polymer material such as polyimide plastic, polyetheretherketone or transparent conductive polyester. The polyimide material used in the present invention has the characteristics of high temperature resistance, wide use range, high melting point, high insulation performance, and stable dielectric constant.

The inorganic film layer 25 is attached to the flexible substrate 24 on one side and to the metal wiring layer 28 on the other side.

The inorganic film layer 25 includes a first insulating layer 25*a*, a second insulating layer 25*b*, and a third insulating layer 25*c*. The first insulating layer 25*a* is disposed on the flexible substrate 24. The second insulating layer 25*b* is disposed on the first insulating layer 25*a*. A middle portion of each of the first insulating layer 25*a* and the second insulating layer 25*b* exposes a part of the flexible substrate 64. The third insulating layer 25*c* is formed by filling an organic material in a plurality of deep holes where the flexible panel is to be bent. The bending region 22 can be bent because the deep holes are filled by the organic material.

Since the bending region 22 is the bending or folding region of the flexible panel, the bending region 22 is usually provided with the inorganic film layer 25 containing no metal. Since the inorganic film layer 25 is easily to be cracked or even broken due to bending or folding, it is necessary to fill the deep holes with an organic material to form the third insulating layer 25*c*.

Figure 7:
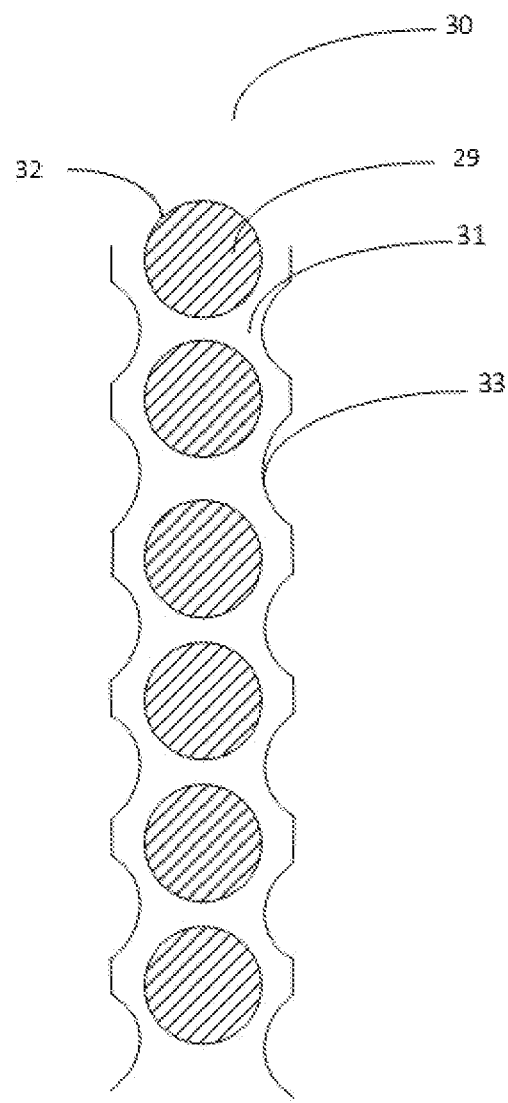
FIG. 7 is a schematic structural view of a portion of the metal wiring according to the first embodiment of the present invention.

FIG. 7 is a schematic structural view showing a portion of the metal wiring according to the first embodiment of the present invention. As shown in FIG. 7, the metal wiring 28 is attached to the inorganic film layer 25 on a side thereof away from the flexible substrate, and a plurality of metal wirings 30 parallel to each other are disposed on the metal wiring layer 28. The plurality of metal wirings 30 are evenly distributed in the bending region 22.

Each of the metal wirings 30 is in a long strip shape and includes a metal strip 31 and a plurality of openings 32.

The plurality of openings 32 are formed in the metal strip 31 along the direction of the bending region 22. The plurality of openings 32 are arranged in a straight line and evenly distributed along the metal strip 31. The cross-sectional diameter of the opening 32 is smaller than the width of each of the metal wirings 30, so that the bending region 22 is easily to be bent.

Each of the openings 32 is circular, and the plurality of openings 32 are arranged in a straight line and are evenly distributed in the bending region 22.

The plurality of openings 32 in each of the metal wirings 30 are defined through the metal strip 31 thereby exposing a portion of the flexible substrate. A coating layer 29 is made of organic material, and the coatings layer 29 fills the plurality of openings 32 and covers the metal wirings 30. The coating layer 29 is attached to a side of the metal wiring layer 28 away from the inorganic layer 25. Therefore, the bending region 22 can be subjected to greater pressure and the organic material can protect the flexible substrate.

The openings mentioned in the present invention can be formed by laser technology or etching methods. The preferred method is etching, and the etching can be divided into dry etching and wet etching. Wet etching is performed by using a solvent or a solution, and dry etching includes photo-evaporation, vapor phase etching, and the like. Dry etching has the advantages of good anisotropy, controllability, flexibility, and good repeatability, and can be the preferred method of the present invention.

As shown in FIG. 7, the left and right sides of the metal wiring 30 in the first embodiment include at least one notch 33. The notches 33 each are in an arcuate or a semicircular shape. The middle of each notch 33 and portions of the metal strip 31 between two adjacent openings 32 are symmetrically disposed; portions of the metal wiring 33 on both sides of the opening 32 are centrally symmetric. A ratio of a minimum distance from a point of an edge of one of the openings 32 to a neighboring side of the metal strip 31 to a minimum width of the metal strip 31 is preferably 0.1, 0.2, 0.3, 0.4, 0.5, 0.6 or 0.7. The stresses on the metal wiring 30 are easily concentrated in the narrowest position of a metal region during a bending process; in this embodiment. The distance between the metal wiring 30 and the edge of each of the openings 32 is enlarged. The difference between the maximum width of the metal region of the metal wiring 30 and the minimum width of the metal region of the metal wiring 30 is reduced. The difference in the widths of the metal regions throughout the metal wiring 30 becomes smaller. During the bending process, the stresses on the metal wiring 30 are not easily concentrated at one point, but can be distributed as uniformly as possible in various positions, thereby effectively preventing the metal wiring 30 from breakage during the bending process, and effectively enhancing lifetime of the metal wiring 30 and the bending region 22.

In order to fully utilize the metal wiring layer 28 of the first embodiment, an anode layer 26 and a pixel layer 27 are sequentially formed on the metal wiring layer 28 to form the bending region of the display panel 20. Therefore, the bending region 22 can display.

In order to enable the bending region and the display region to display, the present invention also provides a flexible display panel. As shown in FIG. 6, one end of a first wiring 210 is connected to the bending region 22, and the other end of the first wiring 210 is connected to the display region 21. One end of a second wiring 211 is connected to the bending region 22, and the other end of the second wiring 211 is connected to the drive circuit 23. Thus, the signal of the drive circuit 23 can be transmitted to the display region 21 through the bending region 22, so that the entire display region 21 can display.

Figure 8:
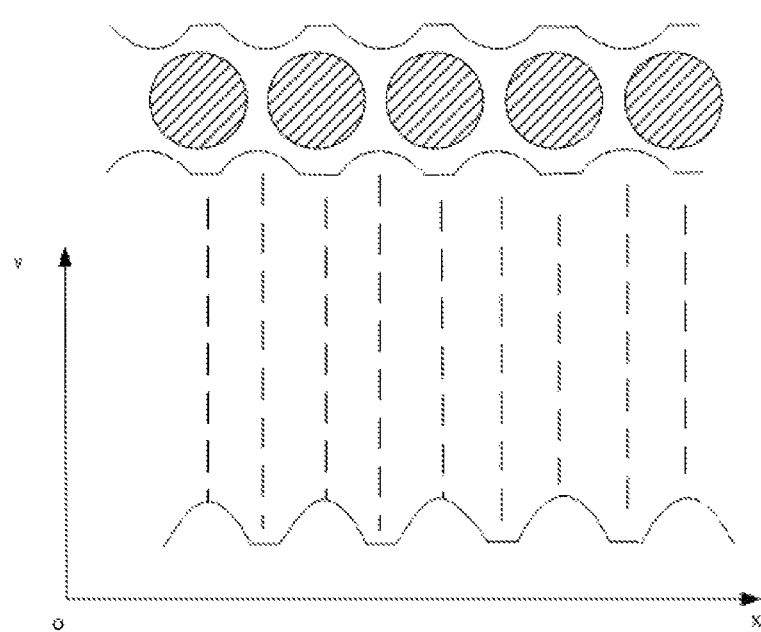
FIG. 8 is a stress distribution diagram of the metal wiring according to the first embodiment of the present invention.

FIG. 8 is a stress distribution diagram according to the first embodiment of the present invention, wherein the x-axis is a direction along which a metal wiring is extended, and the y-axis is the magnitude of a stress value. It can be seen from FIG. 8 that the stress distribution on the metal wiring is more uniform during the bending process, and the stress value of the area of the first embodiment which has a high risk of breakage is significantly lower than the stress value of the area of the existing metal wiring structure which has a high risk of breakage, and the technical effect of the first embodiment can be proved.

The present invention also provides a display device including the flexible display device as described above, and the display device can be an electronic device such as a mobile phone, a tablet computer or a laptop. The display can be bent and can withstand greater bending force, and can also clearly display an image.

Second Embodiment

Figure 9:
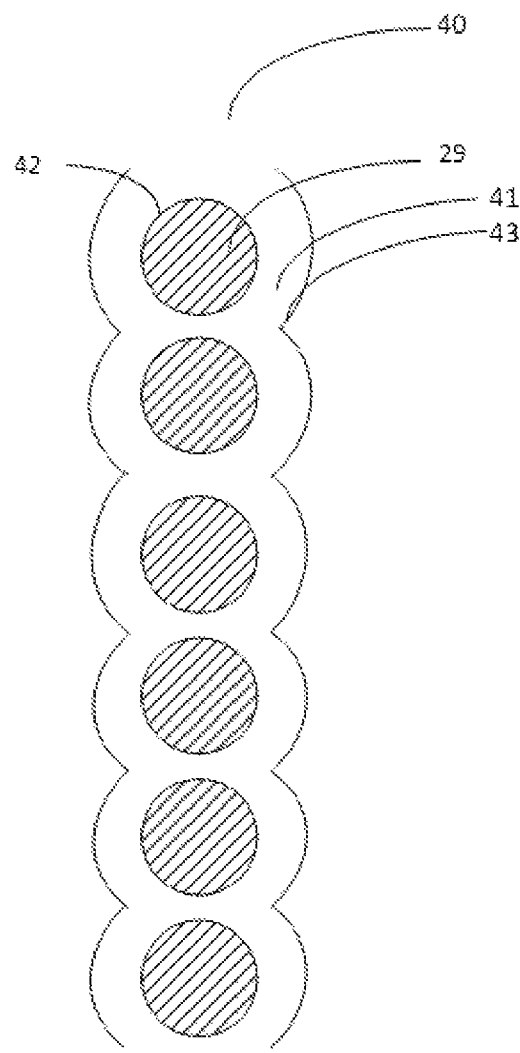
FIG. 9 is a schematic structural view showing a portion of the metal wiring according to the second embodiment of the present invention.

FIG. 9 is a schematic structural diagram of a metal wiring according to the second embodiment. The present invention further provides the second embodiment, and the second embodiment includes most of the technical solutions in the first embodiment. The difference between the first embodiment and the second embodiment is shown in FIG. 8. The left and right sides of a metal wiring 40 in the second embodiment respectively include at least one notch 43. The middle of each the notch 43 and portions of the metal strip 41 between two adjacent openings 42 are symmetrically disposed. A bottom of cross section of each of the notches 43 is a sinusoid, a parabola or a circular arc.

A ratio of a minimum distance from a point of an edge of one of the openings 42 to a neighboring side of the metal strip 41 to a minimum width of the metal strip 41 is preferably 0.1, 0.2, 0.3, 0.4, 0.5, 0.6 or 0.7. The stresses on the metal wiring 40 are easily concentrated in the narrowest position of a metal region during a bending process. In this embodiment, the distance between the metal wiring 40 and the edge of each of the openings 42 is enlarged. The difference between the maximum width of the metal region of the metal wiring 40 and the minimum width of the metal region of the metal wiring 40 is reduced. The difference in the width of the metal regions throughout the metal wiring 40 becomes smaller. The stresses on the metal wiring 40 are not easily concentrated at one point during the bending process, but can be distributed as uniformly as possible in various positions, thereby effectively preventing the metal wiring 40 from breakage during the bending process, and effectively enhancing lifetime of the metal wiring 40 and a bending region.

Figure 10:
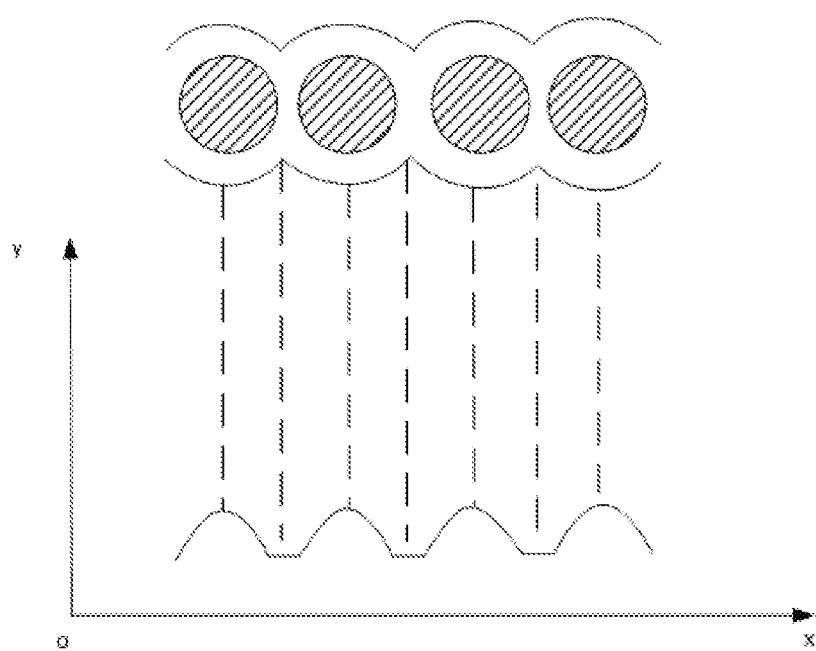
FIG. 10 is a stress distribution diagram of the metal wiring according to the second embodiment of the present invention.

FIG. 10 is a stress distribution diagram according to the second embodiment of the present invention, wherein x-axis is a direction along which a metal wiring is extended, and the y-axis is the magnitude of a stress value. It can be seen from the FIG. 10 that the stress distribution on the metal wiring is more uniform during the bending process, and the stress value area of the second embodiment which has a high risk of breakage is significantly lower than the stress value of the high-risk breakage area of the existing metal wiring structure which has a high risk of breakage, and the technical effect of the first embodiment can be proved.

Figure 11:
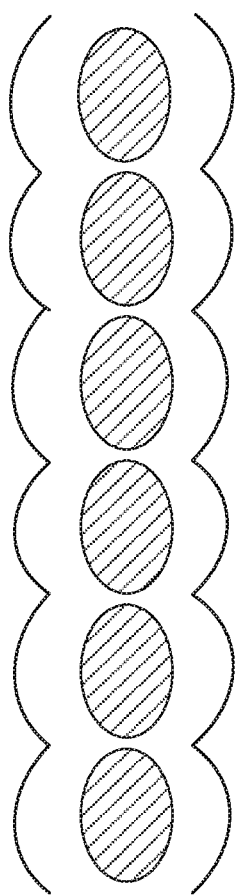
FIG. 11 and FIG. 12 are schematic views showing elliptical openings according to the second embodiment of the present invention.
Figure 12:
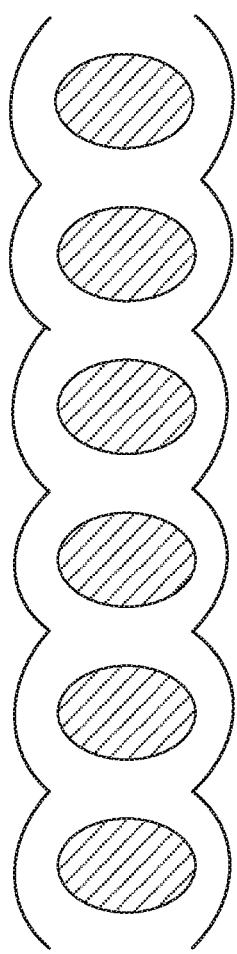

In the second embodiment, the openings 42 may also be elliptical. As shown in FIG. 11 and FIG. 12, the major axis direction of an elliptical opening is parallel to the direction of the symmetry axis of a metal strip in FIG. 11. The major axis direction of an elliptical opening is perpendicular to the direction of the symmetry axis of a metal trip in FIG. 12.

The present invention also provides a display device including the flexible display device as described above, and the display device can be an electronic device such as a mobile phone, a tablet computer or a laptop. The display can be bent and can withstand greater bending force, and can also clearly display an image.

It should be noted that the invention may be embodied in a variety of variations and modifications, and is not limited to the specific embodiments of the embodiments described above. The above embodiments are merely illustrative of the invention, instead of limiting the invention. In summary, the scope of protection of the present invention should include such alterations, substitutions and modifications as would be apparent to those skilled in the art.

What is claimed is:

1. A flexible display panel, comprising:
    a display region and a bending region, wherein the bending region comprises:
    a flexible substrate;
    an inorganic film layer disposed on the flexible substrate;
    a metal wiring layer disposed on the inorganic film layer; and
    a coating layer disposed on the metal wiring layer;
    wherein the metal wiring layer comprises a plurality of metal wirings, and each metal wiring being in a long strip shape and comprising:
    a metal strip; and
    a plurality of openings through the metal strip;
    wherein in the width direction of the metal strip, a ratio of a minimum distance from a point of an edge of one of the openings to a neighboring side of the metal strip to a minimum width of the metal strip ranges from 0.1 to 0.7; and
    wherein the coating layer is made of organic material, and the coating layer fills the openings and covers the metal wirings.

2. The flexible display panel as claimed of claim 1, wherein two or more of the metal wirings are parallel to each other and evenly distributed in the bending region.

3. The flexible display panel as claimed of claim 1, wherein the coating layer is attached to a side of the metal wiring layer away from the inorganic layer.

4. The flexible display panel as claimed of claim 1, wherein each of the metal wirings comprises:
    a plurality of notches provided in at least one side of the each metal wiring.

5. A display device comprising the flexible display panel according to claim 1.

6. The flexible display panel as claimed of claim 4, wherein two or more of the openings are arranged in a straight line and evenly distributed along the metal strip; and portions of the metal strip between the middle of each notch and two adjacent openings are symmetrically disposed.

7. The flexible display panel as claimed of claim 4, wherein the notches each are in an arcuate or a semicircular shape.

8. The flexible display panel as claimed of claim 4, wherein a bottom of a cross section of each of the notches is a smooth arc.

9. The flexible display panel as claimed of claim 8, wherein the smooth arc is a sinusoid, a parabola or a circular arc.

* * * * *